(12) United States Patent
Kang et al.

(10) Patent No.: US 7,920,244 B2
(45) Date of Patent: Apr. 5, 2011

(54) LIQUID CRYSTAL DISPLAY DEVICE AND METHOD OF FABRICATING THE SAME

(75) Inventors: Dong-Ho Kang, Gumi-si (KR); Young-Il Seo, Gumi-si (KR); Sung-Hyun Cho, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 11/638,385

(22) Filed: Dec. 14, 2006

(65) Prior Publication Data

US 2007/0263162 A1 Nov. 15, 2007

(30) Foreign Application Priority Data

May 10, 2006 (KR) .................. 10-2006-0041835

(51) Int. Cl.
*G02F 1/1339* (2006.01)
(52) U.S. Cl. ...................................... 349/157
(58) Field of Classification Search ......... None
See application file for complete search history.

(56) References Cited

U.S. PATENT DOCUMENTS

2005/0243262 A1* 11/2005 Kim et al. ............. 349/156

FOREIGN PATENT DOCUMENTS

| CN | 1497299 | 5/2004 |
|----|---------|--------|
| CN | 1614486 | 5/2005 |
| CN | 2699333 | 5/2005 |
| JP | 2002-341354 | 11/2002 |
| JP | 2002-341382 | 11/2002 |
| JP | 2005-189662 | 7/2005 |
| KR | 1020050004547 | 1/2005 |
| KR | 2005-39981 | 5/2005 |
| KR | 2005-86342 | 8/2005 |
| KR | 2006-31419 | 4/2006 |

* cited by examiner

*Primary Examiner* — Timothy Rude
(74) *Attorney, Agent, or Firm* — McKenna Long & Aldridge LLP

(57) ABSTRACT

A liquid crystal display device includes an array substrate including: gate and data lines crossing each other to define a pixel region on a first substrate; a thin film transistor connected to the gate and data lines; and first and second height adjusters; an opposing substrate facing the array substrate; a liquid crystal layer between the array substrate and the opposing substrate; a gap spacer corresponding to the first height adjuster and contacting the array substrate and the opposing substrate; a first press-buffer spacer corresponding to the second height adjuster, contacting the opposing substrate and spaced apart from the array substrate; and a second press-buffer spacer contacting the opposing substrate and spaced apart form the array substrate, wherein a distance between the first press-buffer spacer and the array substrate is substantially less than a distance between the second press-buffer spacer and the array substrate.

16 Claims, 21 Drawing Sheets

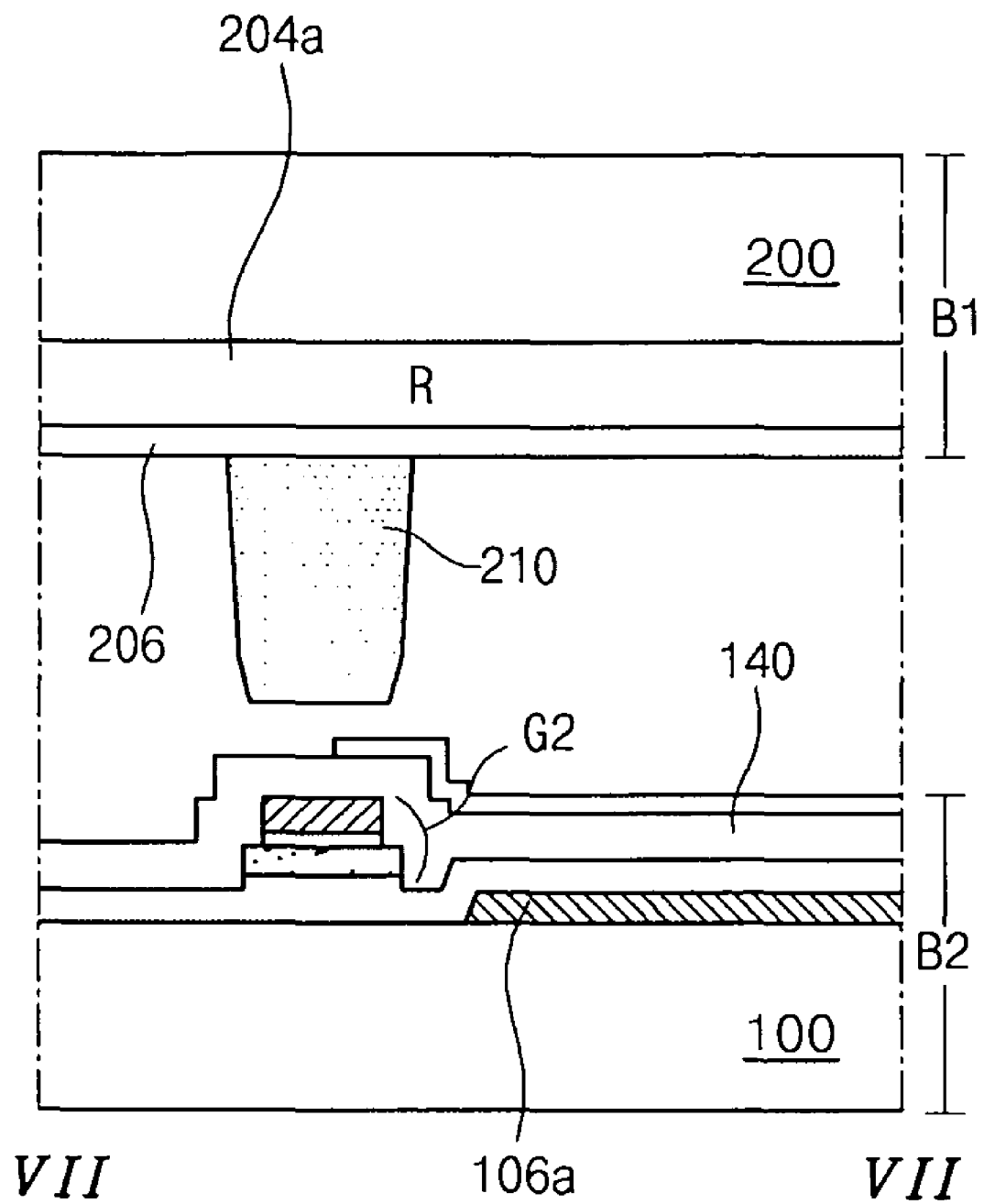

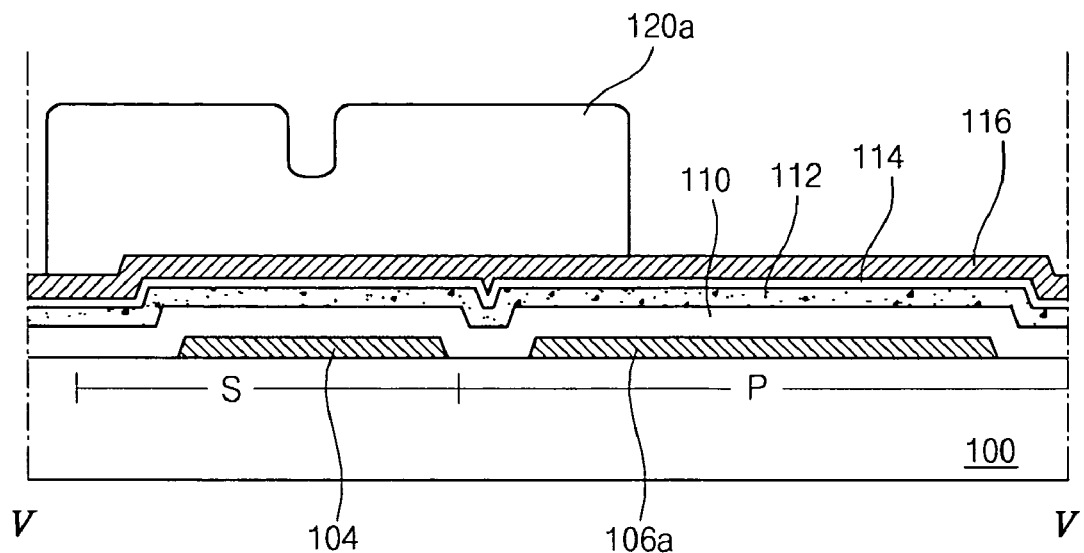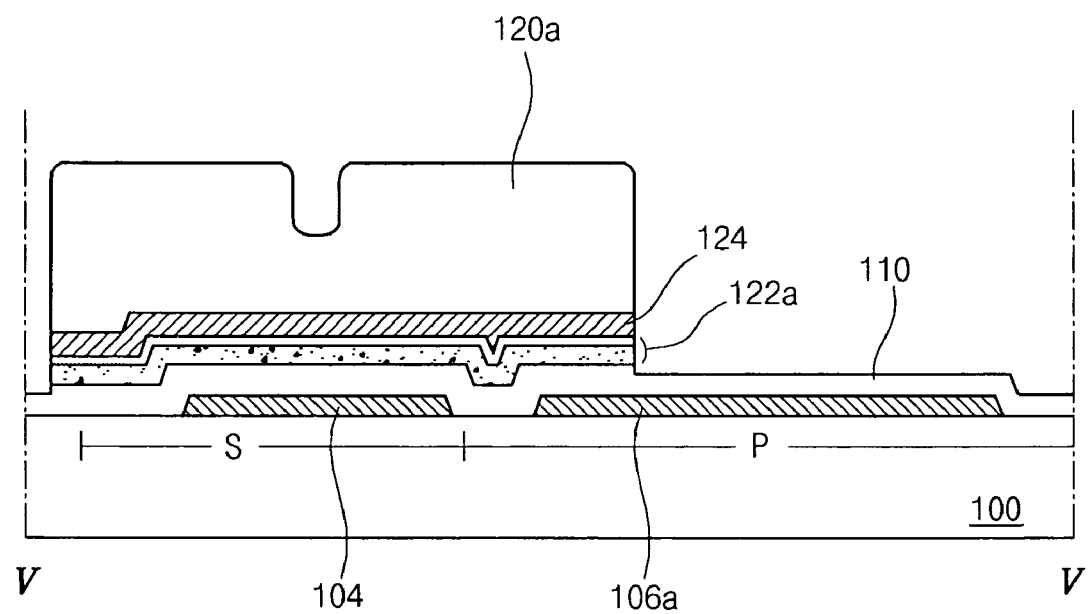

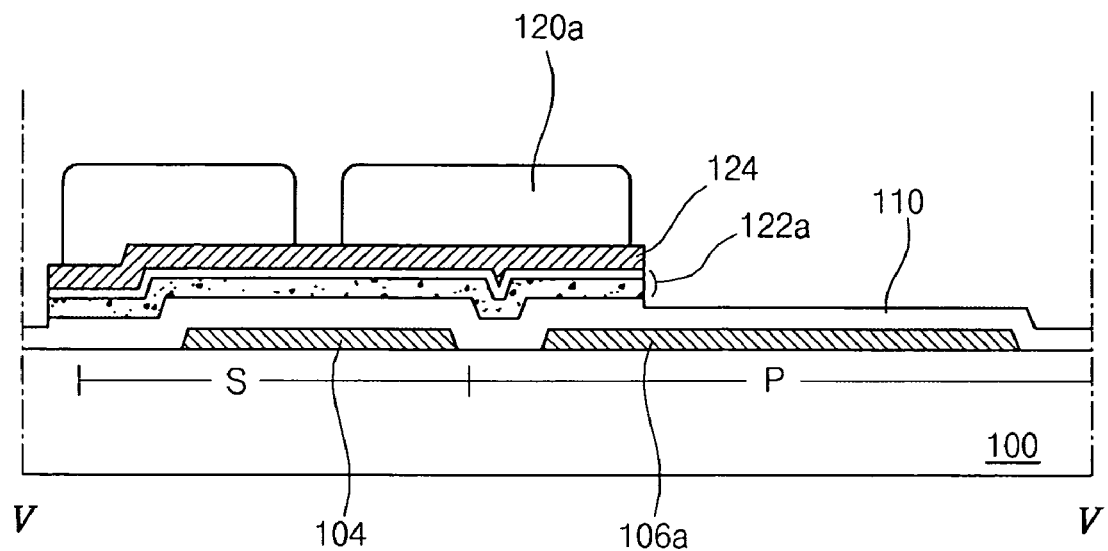
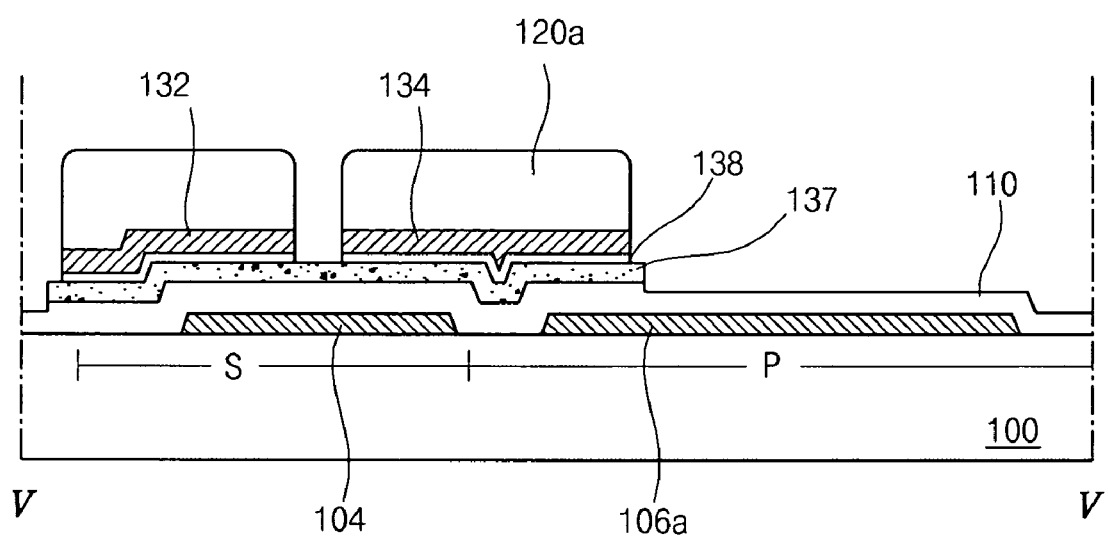

FIG. 10A
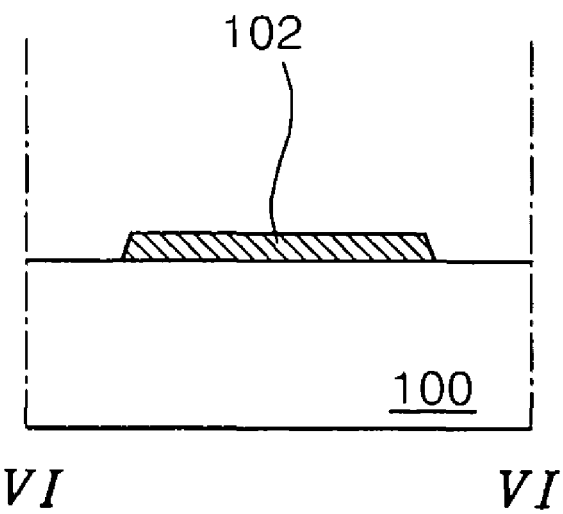
FIG. 10B
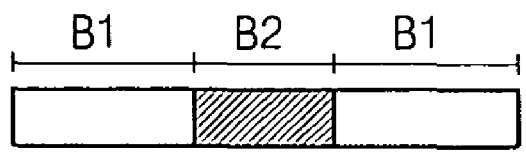
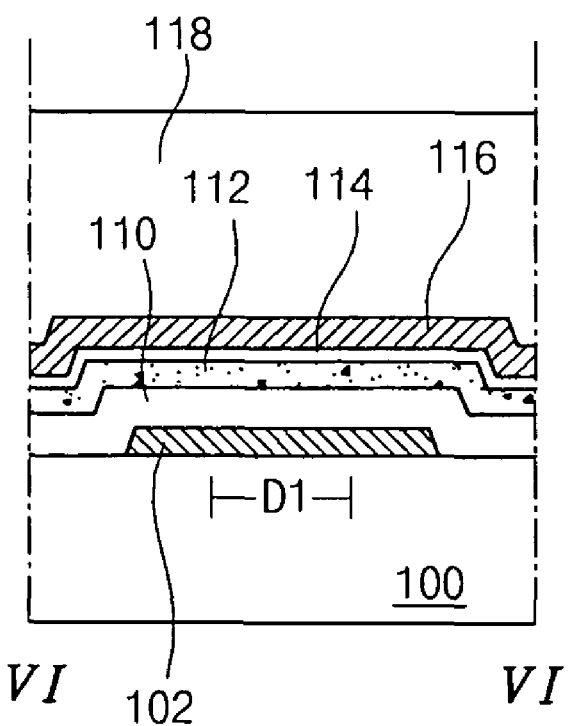

LIQUID CRYSTAL DISPLAY DEVICE AND METHOD OF FABRICATING THE SAME

The present invention claims the benefit of Korean Patent Application No. 2006-0041835, filed in Korea on May 10, 2006, which is hereby incorporated by reference for all purposes as if fully set forth herein.

BACKGROUND OF THE INVENTION

1. Field of the Invention

The present invention relates to a liquid crystal display device, and more particularly, to a liquid crystal display (LCD) device and a method of fabricating the same.

2. Discussion of the Related Art

Until recently, display devices have typically used cathode-ray tubes (CRTs). Presently, many efforts and studies are being made to develop various types of flat panel displays, such as liquid crystal display (LCD) devices, plasma display panels (PDPs), field emission displays, and electro-luminescence displays (ELDs), as a substitute for CRTs. Of these flat panel displays, LCD devices have many advantages, such as high resolution, light weight, thin profile, compact size, and low voltage power supply requirements.

In general, an LCD device includes two substrates that are spaced apart and face each other with a liquid crystal material interposed between the two substrates. The two substrates include electrodes that face each other such that a voltage applied between the electrodes induces an electric field across the liquid crystal material. Alignment of the liquid crystal molecules in the liquid crystal material changes in accordance with the intensity of the induced electric field into the direction of the induced electric field, thereby changing the light transmissivity of the LCD device. Thus, the LCD device displays images by varying the intensity of the induced electric field.

FIG. 1 is a perspective view illustrating an LCD device according to the related art.

Referring to FIG. 1, the LCD device 11 includes an array substrate B2, a color filter substrate B1 and a liquid crystal layer 14 between the two substrates B1 and B2.

The array substrate B2 includes gate and data lines 12 and 24 crossing each other to define a pixel region P on a first substrate 22. A thin film transistor T is located at a crossing of the gate and data lines 12 and 24. The thin film transistor T includes a gate electrode 30, a semiconductor layer 32 and source and drain electrodes 34 and 36. A pixel electrode 17 is disposed in the pixel region P and connected to the drain electrode 36.

The color filter substrate B1 includes red (R), green (G) and blue (B) color filter patterns 7a, 7b and 7c in respective pixel regions P and a black matrix 6 between the color filter patterns 7a, 7b and 7c, on a second substrate 5. A common electrode 18 is disposed on the color filter patterns 7a, 7b and 7c.

Liquid crystal molecules of the liquid crystal layer 14 are initially oriented by alignment layers (not shown). When voltages are applied to the pixel and common electrodes 17 and 18, a vertical electric field is induced. The liquid crystal molecules are arranged by the induced electric field, and the light transmissivity of the LCD device 11 is changed, thus images are displayed.

The LCD device operated by the vertically induced electric field has a disadvantage in failing to achieve a wide viewing angle. To achieve a wide viewing angle, an IPS-LCD (in-plane switching mode LCD) device is suggested. The IPS-LCD device is operated by an in-plane electric field.

FIG. 2 is a plan view illustrating an IPS-LCD device according to the related art.

Referring to FIG. 2, in an array substrate of the related art IPS-LCD device, a gate line 52 and first and second common lines 56a and 56b extend along a first direction on a substrate 50. A data line 72 extends along a second direction crossing the first direction. The gate line 52 and the data line 72 define a pixel region P.

A thin film transistor T is located at a crossing of the gate and data lines 52 and 72. The thin film transistor T includes a gate electrode 54, a semiconductor layer 60 and source and drain electrodes 62 and 64.

A first common electrode 58 is disposed at sides of the pixel region P and connects the first and second common lines 56a and 56b. A second common electrode 82 is connected to the second common line 56b. A pixel electrode 80 is connected to the drain electrode 64 through a connection portion 78. The second common electrode 82 and the pixel electrode 80 are alternately disposed in the pixel region P to induce an in-plane electric field.

The connection portion 78 and the first common line 56a substantially overlap each other to form a storage capacitor Cst.

A color filter substrate (not shown) faces the array substrate. The color filter substrate has a gap spacer 98a and a press-buffer spacer 98b. The gap spacer 98a functions to maintain a cell gap between the array substrate and the color filter substrate. The press-buffer spacer 98b functions to relieve a force applied to a liquid crystal panel from outside, for example, a contact to the liquid crystal panel by a user's finger.

When an outside force is applied to the liquid crystal panel, the liquid crystal panel is bent. Liquid crystal molecules at the bent portion become abnormally arranged as compared to those at a normal portion. This causes retardation of light passing through the bent portion to substantially differ from the retardation of light passing through the normal portion. Accordingly, light leakage occurs, and thus display quality defects such as stains is caused. The press-buffer spacer 98b is used to prevent the above problem.

The gap spacer 98a contacts both the array substrate and the color filter substrate to maintain the cell gap, and the press-buffer spacer 98b is spaced apart from the array substrate.

FIGS. 3 and 4 are cross-sectional views taken along lines III-III and IV-IV of FIG. 2, respectively.

Referring to FIGS. 3 and 4, the related art IPS-LCD device 10 includes an array substrate, a color filter substrate and a liquid crystal layer between the two substrates.

A gate line 52 and a first common line 56a are on a first substrate 50. A gate insulating layer G1 is on the gate line 52 and the first common line 56a. A semiconductor layer 60 is on the gate insulating layer G1, and source and drain electrodes 62 and 64 are on the semiconductor layer 60. The semiconductor layer 60 includes an active layer 60a and an ohmic contact layer 60b. A height adjuster 86 is disposed on the gate insulating layer G1 and corresponds to the gate line 52. The height adjuster 86 includes a semiconductor pattern 86a and a metal pattern 86b. A passivation layer is disposed on the source and drain electrodes 62 and 64 and the height adjuster 86. A thin film transistor T includes a gate electrode 54, the semiconductor layer 60 and the source and drain electrodes 62 and 64. The gate line 52 and a data line (72 of FIG. 2) define a pixel region P.

A black matrix 92 is disposed on a second substrate 90. Red (R), green (G) and blue (B) color filter patterns 94a, 94b and 94c are disposed in the respective pixel regions P. A planarization layer 96 is disposed on the color filter patterns 94a, 94b and 94c.

A gap spacer 98a and a press-buffer spacer 98b are disposed on the planarization layer 96.

The gap spacer 98a is disposed corresponding to the gate line 52, and the press-buffer spacer 98b is disposed corresponding to the first common line 56a. A height of the array substrate corresponding to the gap spacer 98a is substantially higher than a height of the array substrate corresponding to the press-buffer spacer 98b. Because of the height difference, the gap spacer 98a contacts the array substrate, and the press-buffer spacer 98b is spaced apart from the array substrate.

For the height difference, the height adjuster 86 is disposed at the array substrate corresponding to the gap spacer 98a.

The gate line 52 and the first common line 56a have a thickness of about 2000 Å to about 2500 Å, the gate insulating layer G1 has a thickness of about 4000 Å, the semiconductor layer 60 has a thickness of about 2000 Å, and the source and drain electrodes have a thickness of about 3000 Å. The height difference between the array substrate corresponding to the gap spacer 98a and the array substrate corresponding to the press-buffer spacer 98b is about 5500 Å. This height difference is considerable. However, when the array substrate is fabricated by five mask processes, because the metal pattern 86b covers the semiconductor pattern 86a, the height difference is reduced to some extent. Accordingly, the defect resulting from contact with the liquid crystal panel can be reduced.

However, as explained above, the related art IPS-LCD needs five mask processes, thus increasing both cost and fabrication time.

SUMMARY OF THE INVENTION

Accordingly, the present invention is directed to a liquid crystal display device and method of fabricating the same that substantially obviates one or more of the problems due to limitations and disadvantages of the related art.

An advantage of the present invention is to provide a liquid crystal display device and method of fabricating the same that can reduce product cost and fabrication time.

Additional features and advantages of the present invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, a liquid crystal display device includes an array substrate including: gate and data lines crossing each other to define a pixel region on a first substrate; a thin film transistor connected to the gate and data lines; and first and second height adjusters; an opposing substrate facing the array substrate; a liquid crystal layer between the array substrate and the opposing substrate; a gap spacer corresponding to the first height adjuster and contacting the array substrate and the opposing substrate; a first press-buffer spacer corresponding to the second height adjuster, contacting the opposing substrate and spaced apart from the array substrate; and a second press-buffer spacer contacting the opposing substrate and spaced apart form the array substrate, wherein a distance between the first press-buffer spacer and the array substrate is substantially less than a distance between the second press-buffer spacer and the array substrate.

In another aspect, a method of fabricating a liquid crystal display device includes: forming an array substrate including: forming a gate line and a gate electrode on a first substrate; forming a gate insulating layer on the gate line and the gate electrode; and forming a data line crossing the gate line to define a pixel region, a semiconductor layer and source and drain electrodes over the gate electrode, and first and second height adjusters, on the gate insulating layer; forming an opposing substrate facing the array substrate; forming a gap spacer and first and second press-buffer spacers contacting the opposing substrate, wherein the gap spacer corresponds to the first height adjuster and contacts the array substrate, the first press-buffer spacer corresponds to the second height adjuster, and a distance between the first press-buffer spacer and the array substrate is substantially less than a distance between the second press-buffer spacer and the array substrate; and interposing a liquid crystal layer between the array substrate and the opposing substrate.

In another aspect, a liquid crystal display device includes an array substrate including: gate and data lines crossing each other to define a pixel region; an opposing substrate facing the array substrate; a liquid crystal layer between the array substrate and the opposing substrate; a gap spacer contacting the array substrate and the opposing substrate; a first press-buffer spacer contacting one of the array substrate and the opposing substrate and spaced apart from the other of the array substrate and the opposing substrate; and a second press-buffer spacer contacting one of the array substrate and the opposing substrate and spaced apart from the other of the array substrate and the opposing substrate, wherein a distance between the first press-buffer spacer and the other of the array substrate and the opposing substrate spaced apart from the first press-buffer spacer is substantially less than a distance between the second press-buffer spacer and the other of the array substrate and the opposing substrate spaced apart from the second press-buffer spacer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to illustrated embodiments of the present invention, which are illustrated in the accompanying drawings.

Figure 1:
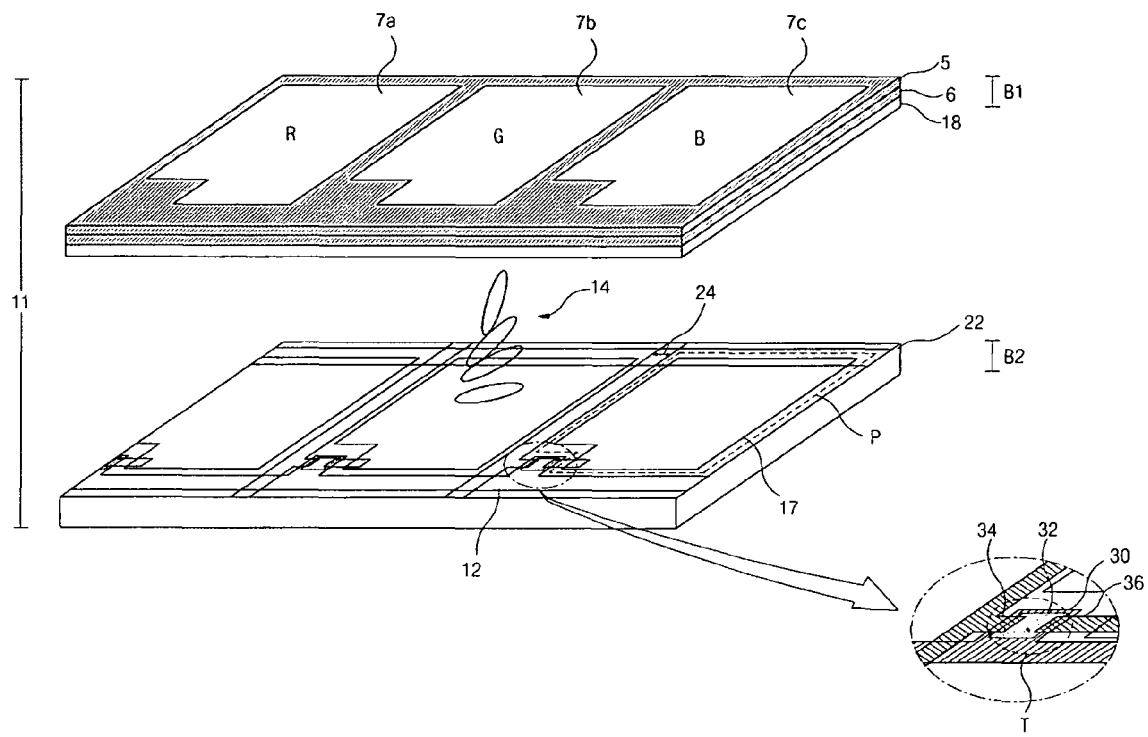
FIG. 1 is a perspective view illustrating an LCD device according to the related art.
Figure 2:
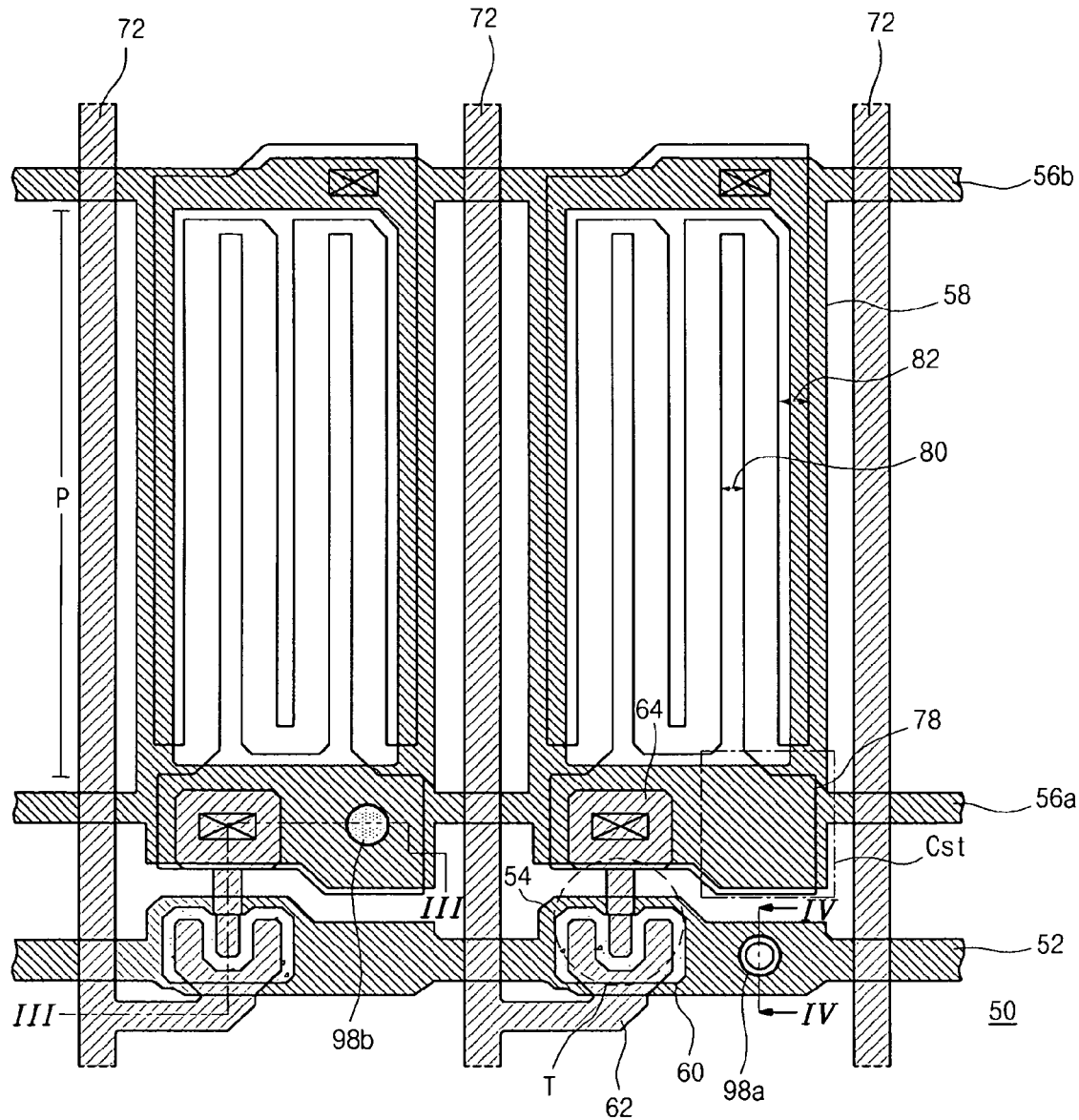
FIG. 2 is a plan view illustrating an IPS-LCD device according to the related art.
Figure 3:
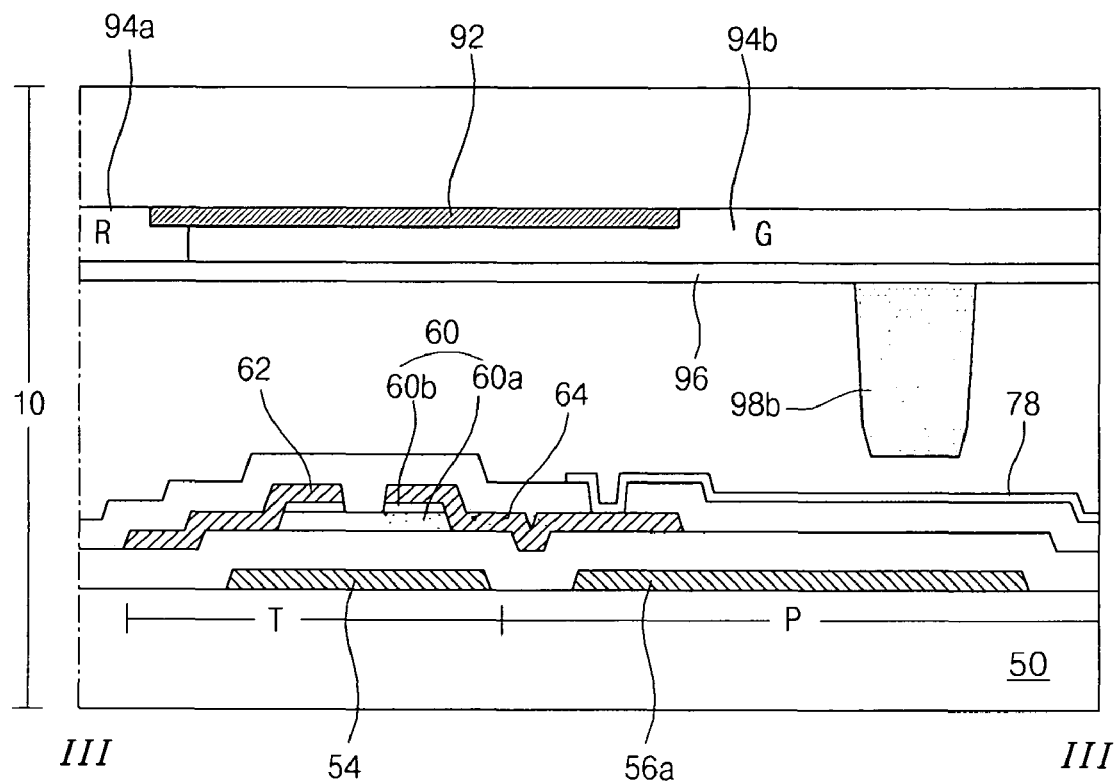
FIGS. 3 and 4 are cross-sectional views taken along lines III-III and IV-IV of FIG. 2, respectively.
Figure 4:
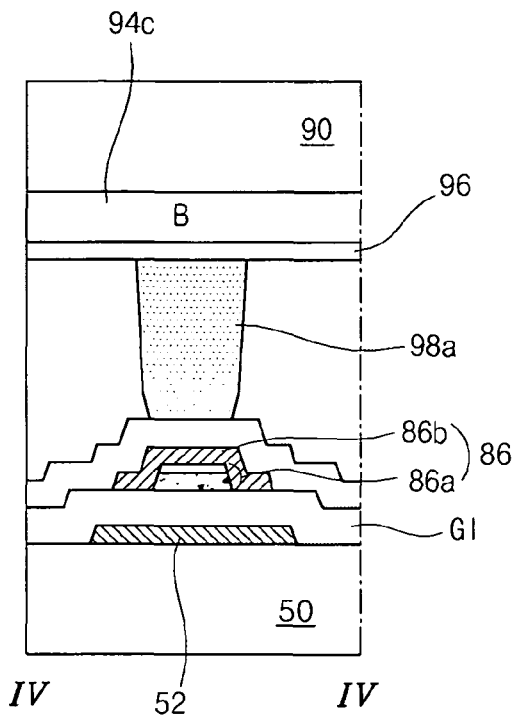
Figure 5:
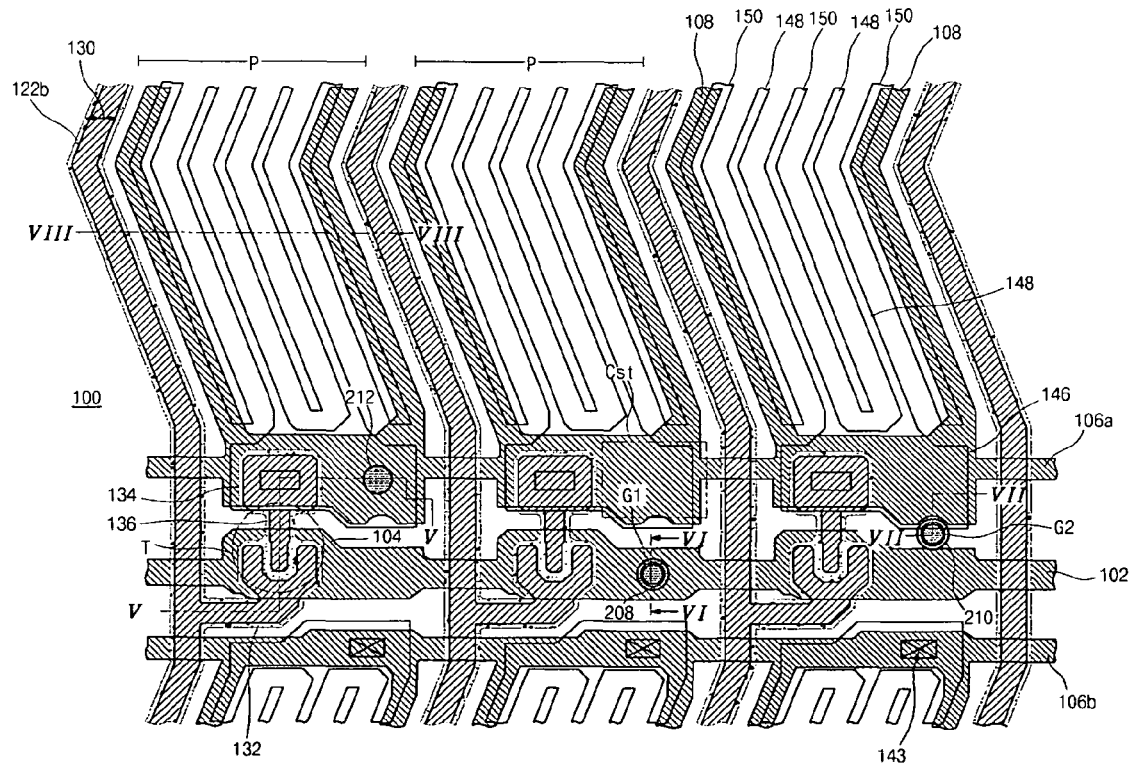
FIG. 5 is a plan view illustrating an IPS-LCD device according to an embodiment of the present invention.

FIG. 5 is a plan view illustrating an IPS-LCD device according to an embodiment of the present invention.

Referring to FIG. 5, in an array substrate of an IPS-LCD device according to an embodiment of the present invention, a gate line 102 and first and second common lines 106a and 106b extend along a first direction on a substrate 100. A data line 130 extends along a second direction crossing the first direction. A semiconductor pattern 122b below the data line 130 extends along the extension direction of the data line 130. The gate line 102 and the data line 130 define a pixel region P.

A thin film transistor T is located at a crossing portion of the gate and data lines 102 and 130. The thin film transistor T includes a gate electrode 104, a semiconductor layer 136 and source and drain electrodes 132 and 134. The semiconductor pattern 122b extends from the semiconductor layer 136.

A first common electrode 108 is located at sides of the pixel region P and connects the first and second common lines 106a and 106b. A second common electrode 150 is connected to the second common line 106b through a common contact hole 143. A pixel electrode 148 is connected to the drain electrode 134 through a connection portion 146. The second common electrode 150 and the pixel electrode 148 are alternately disposed in the pixel region P to induce an in-plane electric field. The outermost second common electrode 150 may substantially overlap the first common electrode 108. Because the first common electrode and the outermost second common electrode 150 are outside the pixel electrode 148, a coupling between the data line 130 and the pixel electrode 148 may be reduced.

The data line 130, the pixel electrode 148 and the first and second common electrodes 108 and 150 may have at least one substantially bent shape. This bent structure produces at least two domains. For example, one domain compensates for a retardation of the other domain. Accordingly, viewing angle may be improved.

The connection portion 146 and the first common line 106a overlap each other to form a storage capacitor Cst.

A color filter substrate (not shown) faces the array substrate. On the color filter substrate, a gap spacer 208 and first and second press-buffer spacers 210 and 212 are formed. The gap spacer 208 functions to maintain a cell gap between the array substrate and the color filter substrate. The first and second press-buffer spacers 210 and 212 withstand a force applied to a liquid crystal panel from outside, for example, a contact with the liquid crystal panel by a user's finger.

The gap spacer 208 contacts both the array substrate and the color filter substrate to maintain the cell gap. The first and second press-buffer spacers 210 and 212 are substantially spaced apart from the array substrate. The gap spacer 208 corresponds to a first height adjuster G1, and the first press-buffer spacer 210 corresponds to a second height adjuster G2. The first and second height adjusters G1 and G2 adjust heights of portions of the array substrate corresponding to the gap spacer 208 and the first press-buffer spacer 210.

Figure 6:
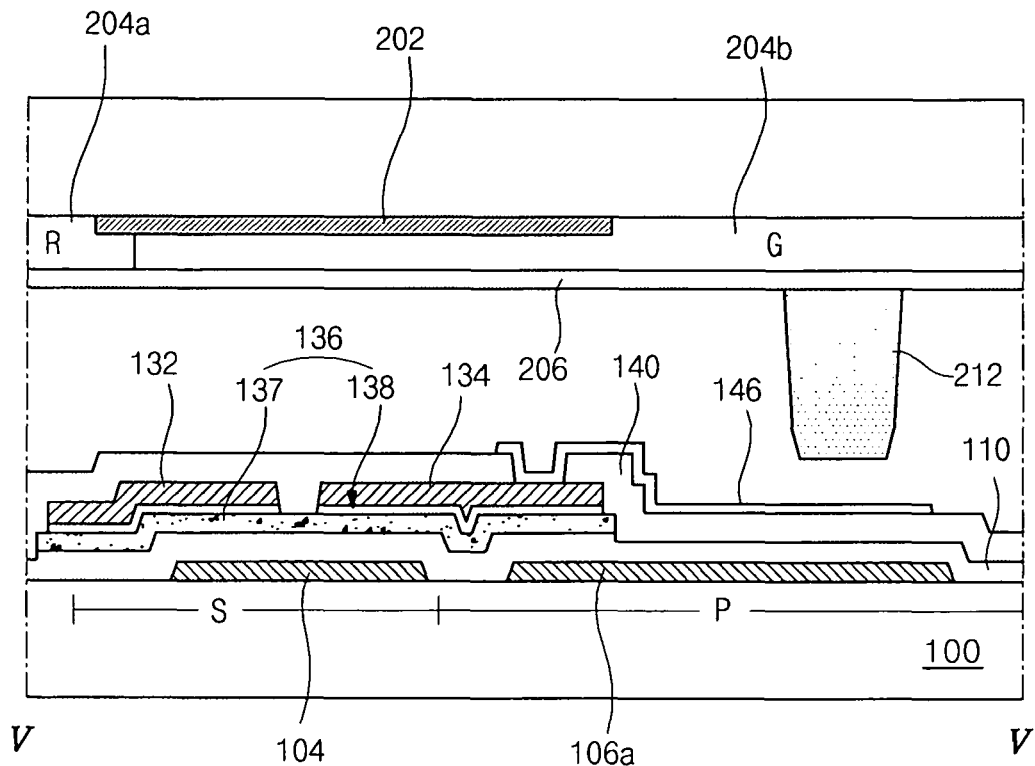
FIGS. 6 through and including 8 are cross-sectional view taken along lines V-V, VI-VI and VII-VII of FIG. 5, respectively.
Figure 7:
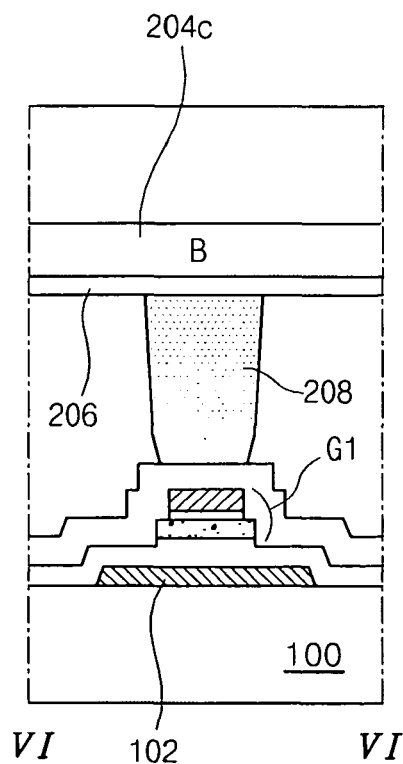
Figure 9A:
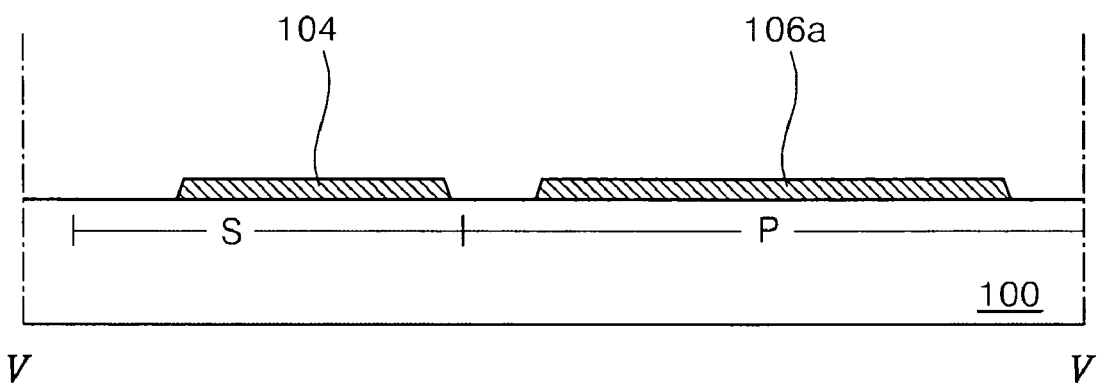
FIGS. 9A through and including 9H, 10A through and including 10H, 11A through and including 11H and 12A through and including 12H are cross-sectional views, taken along lines V-V, VI-VI, VII-VII and VIII-VIII of FIG. 5, respectively, illustrating a method of fabricating an array substrate for an IPS-LCD device according to an embodiment of the present invention.
Figure 9B:
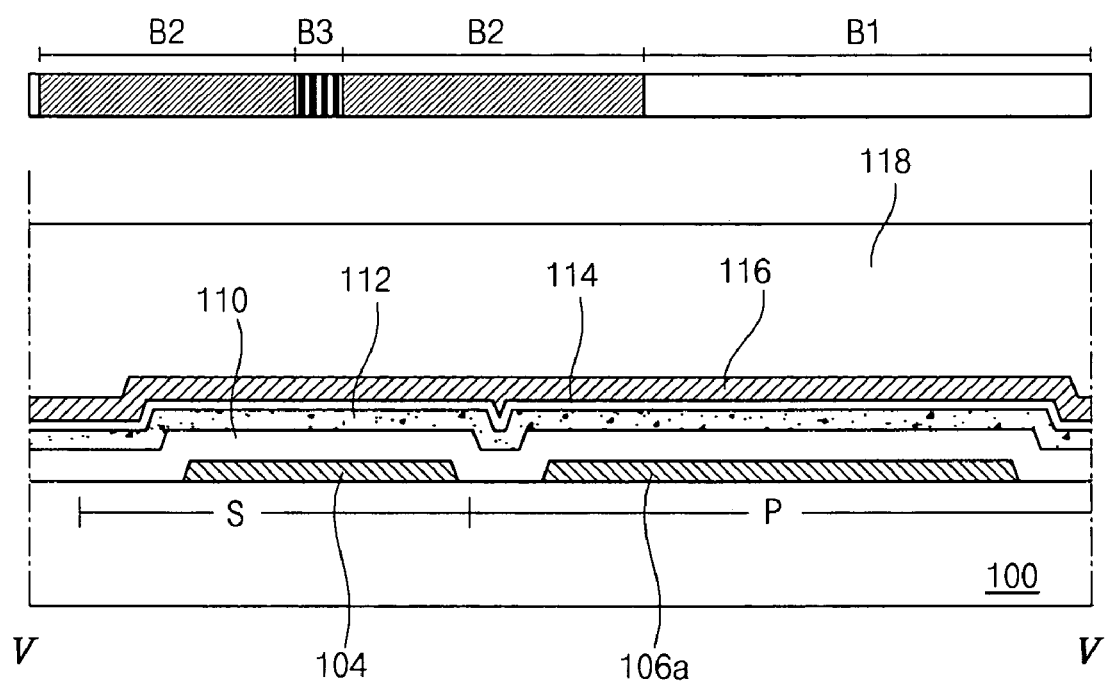
Figure 9G:
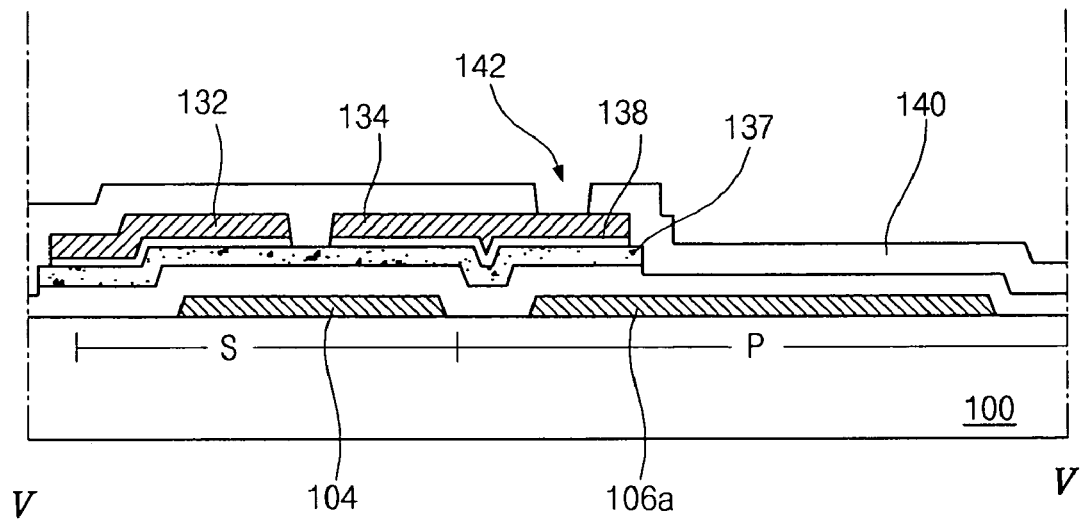
Figure 9H:
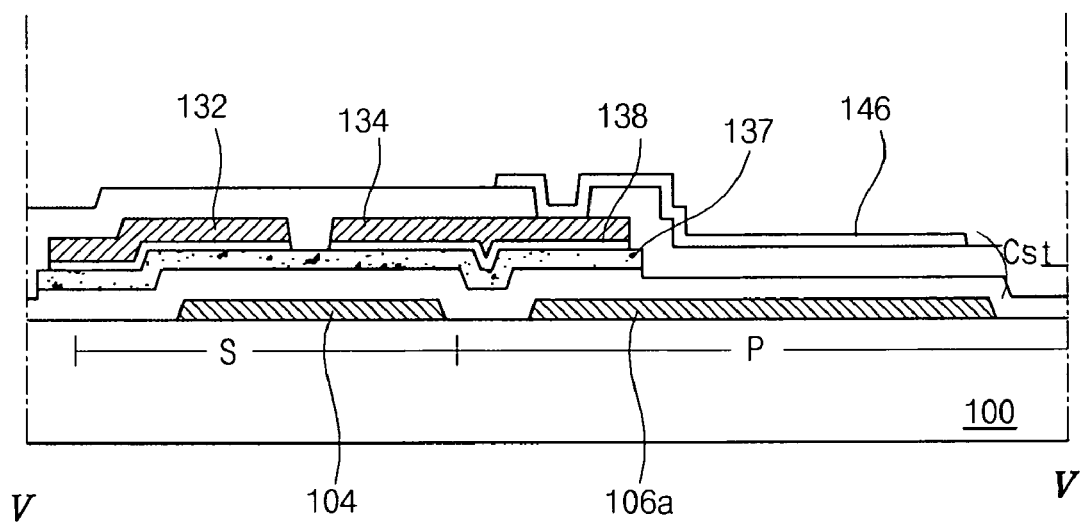
Figure 10C:
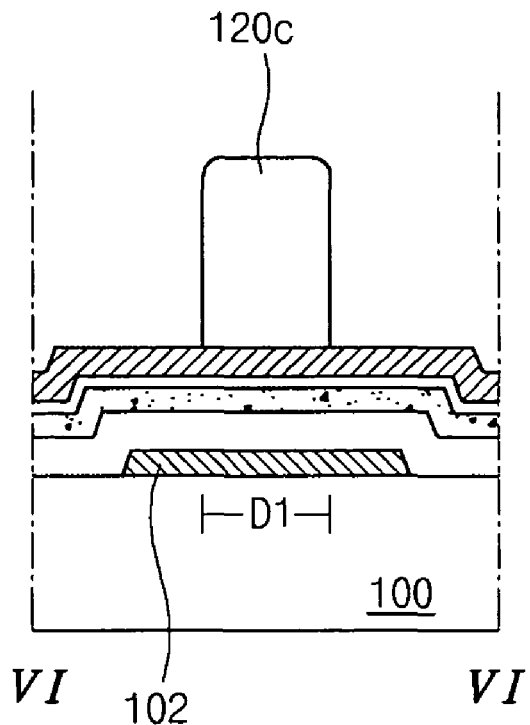
Figure 10D:
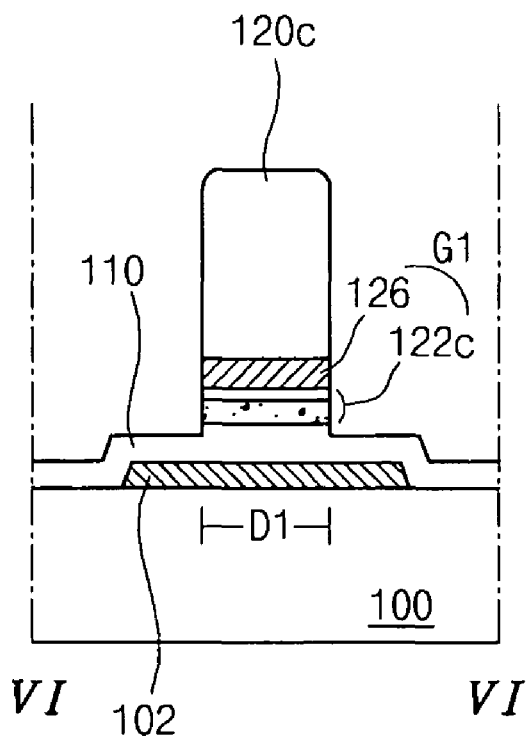
Figure 10E:
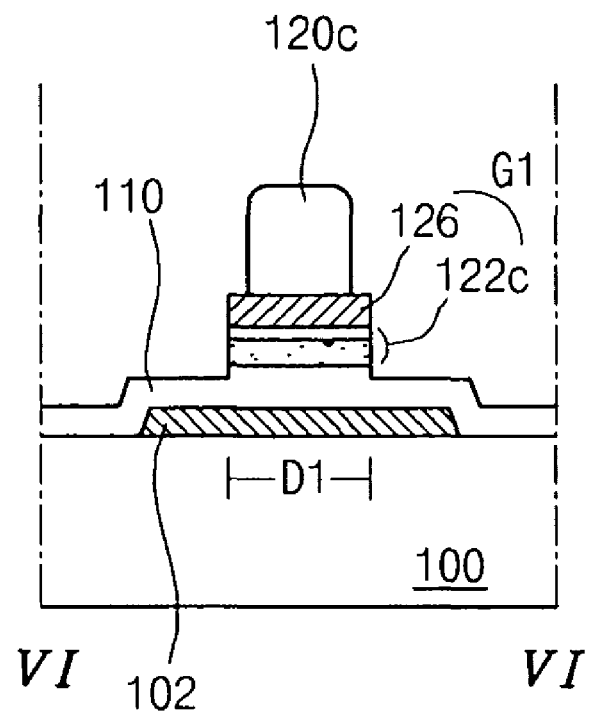
Figure 10F:
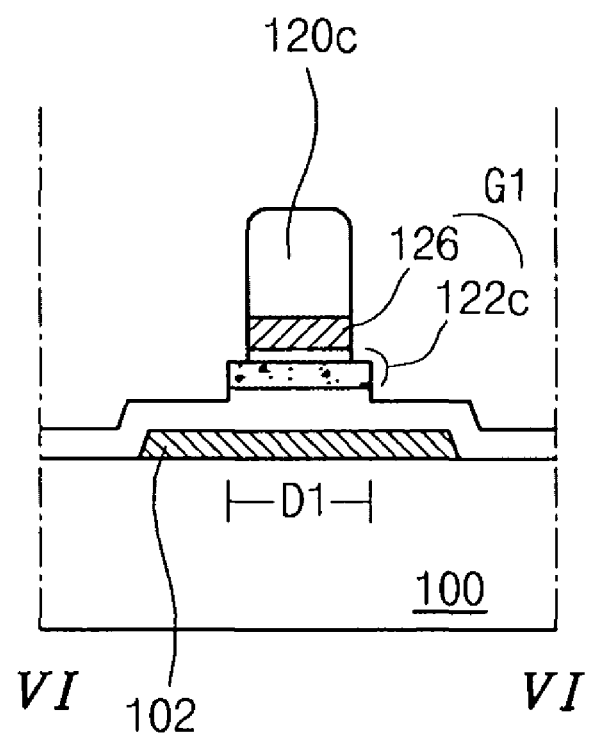
Figure 10G:
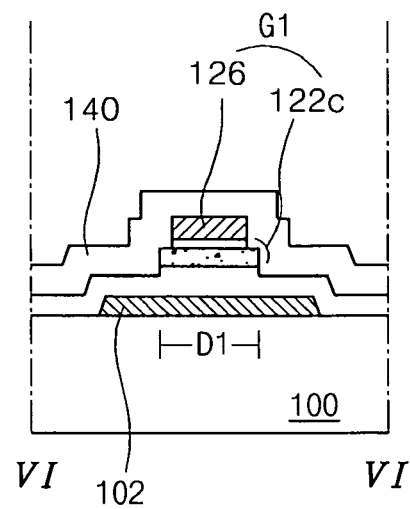
Figure 10H:
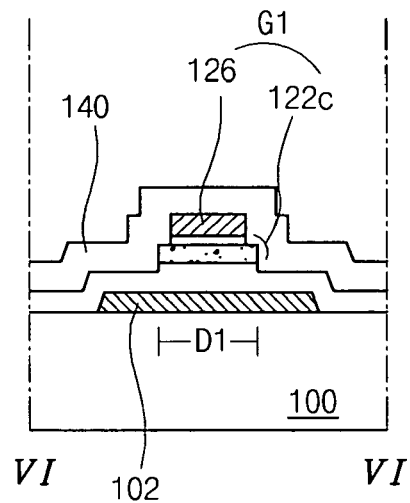
Figure 11A:
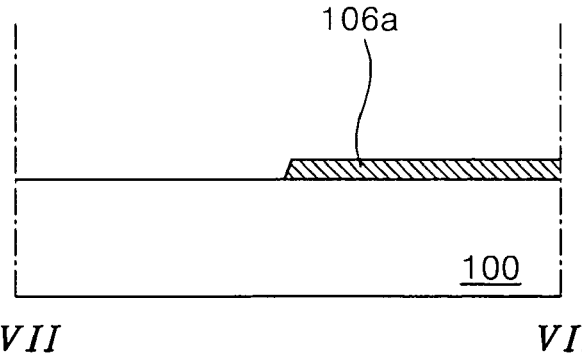
Figure 11B:
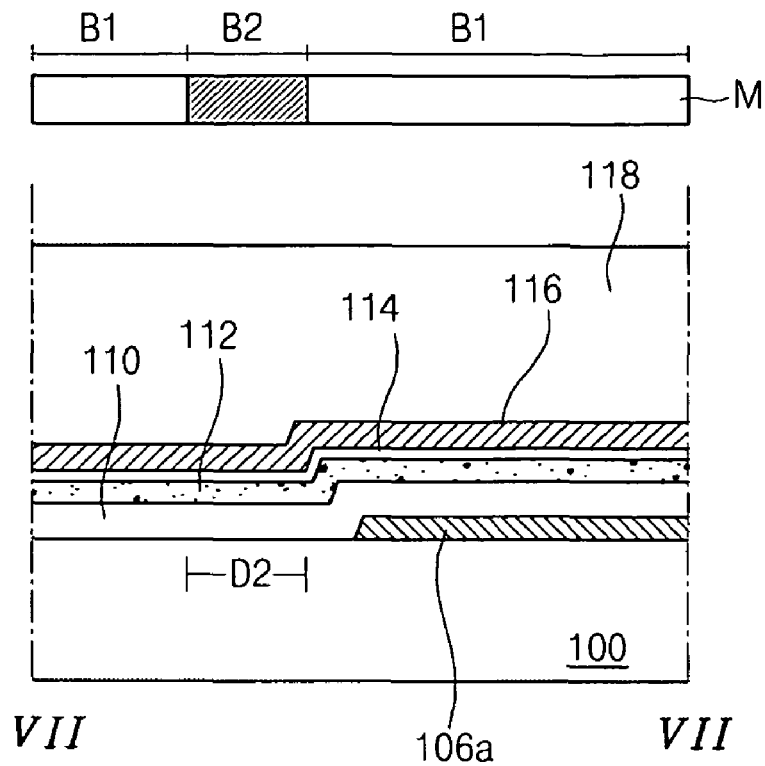
Figure 11C:
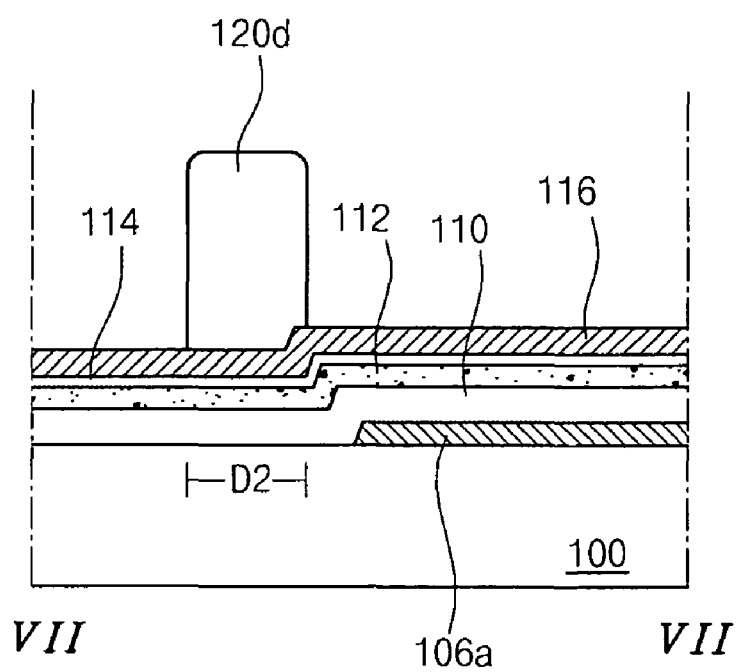
Figure 11D:
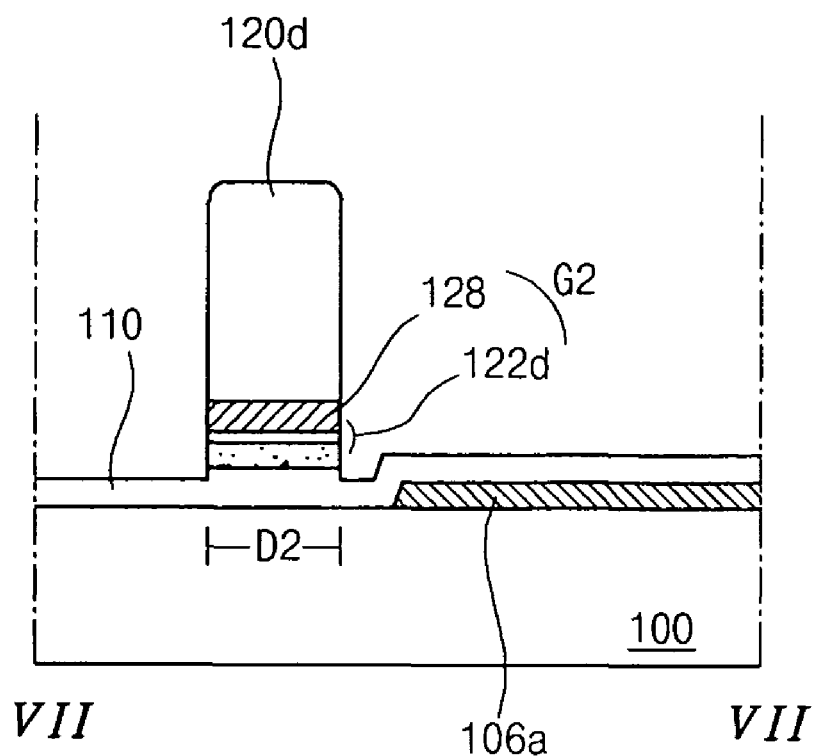
Figure 11E:
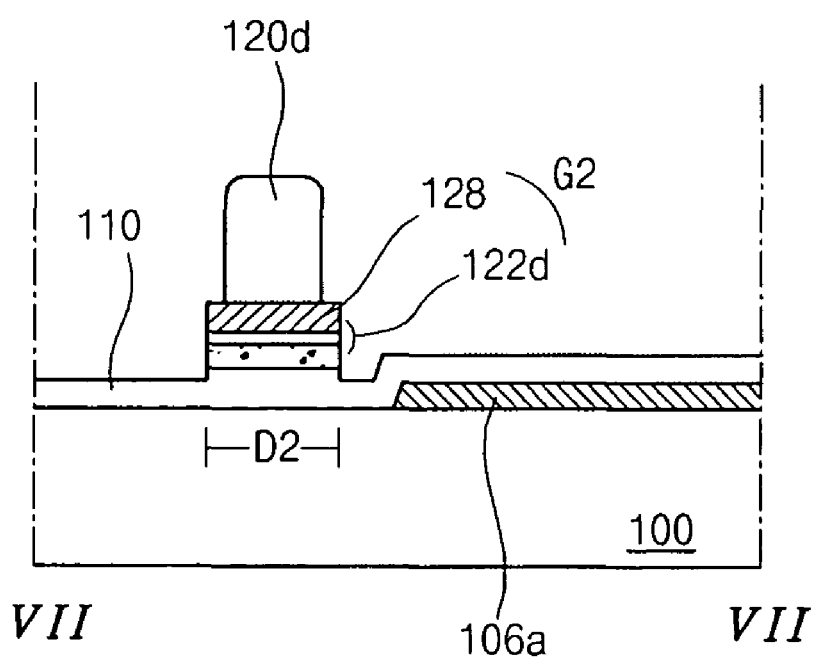
Figure 11F:
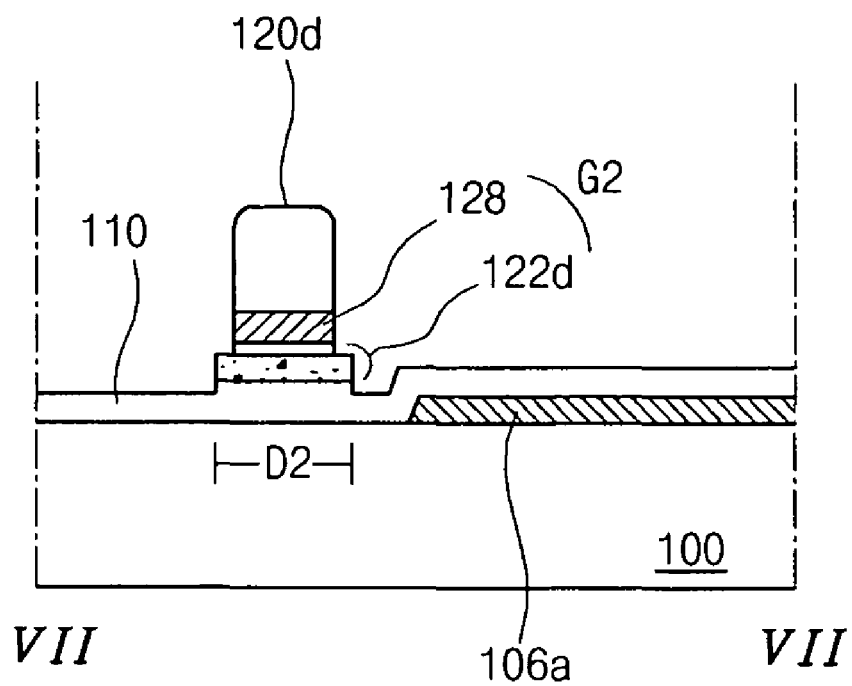
Figure 11G:
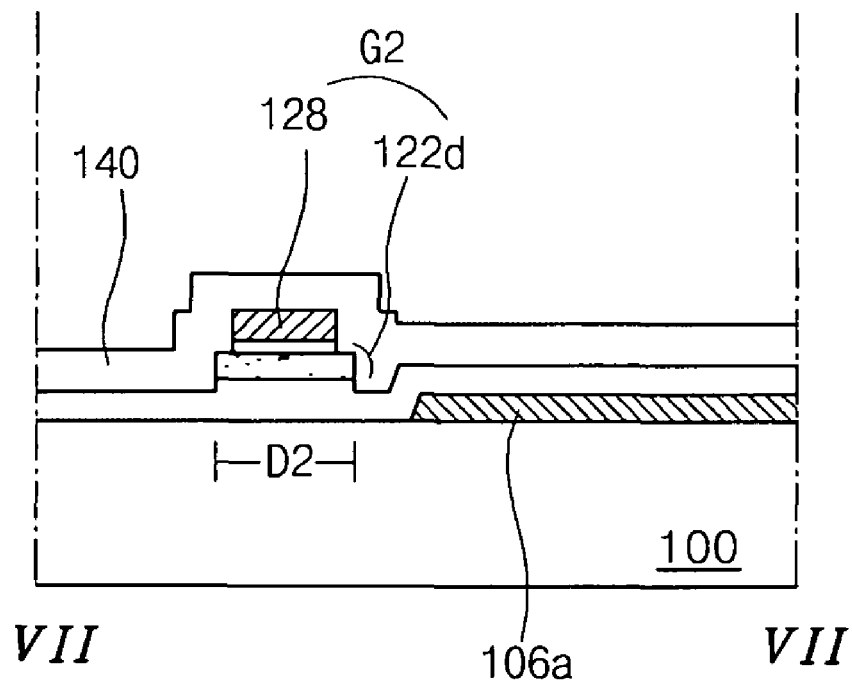
Figure 11H:
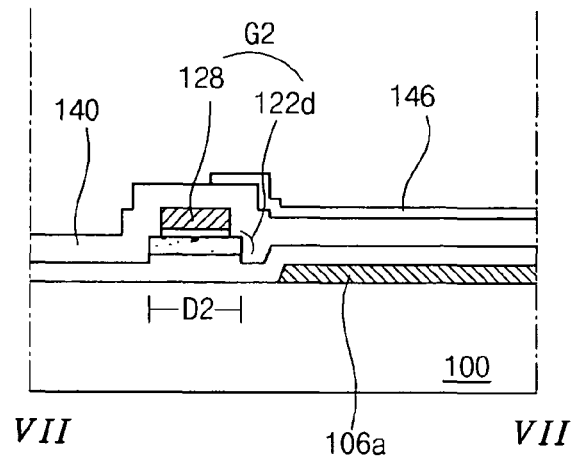
Figure 12A:
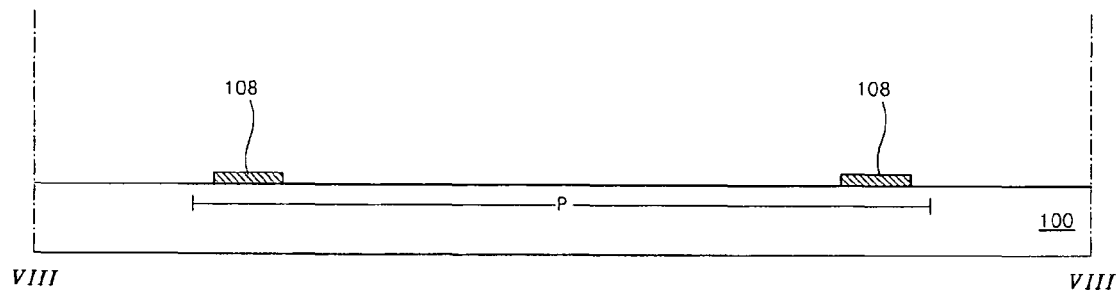
Figure 12B:
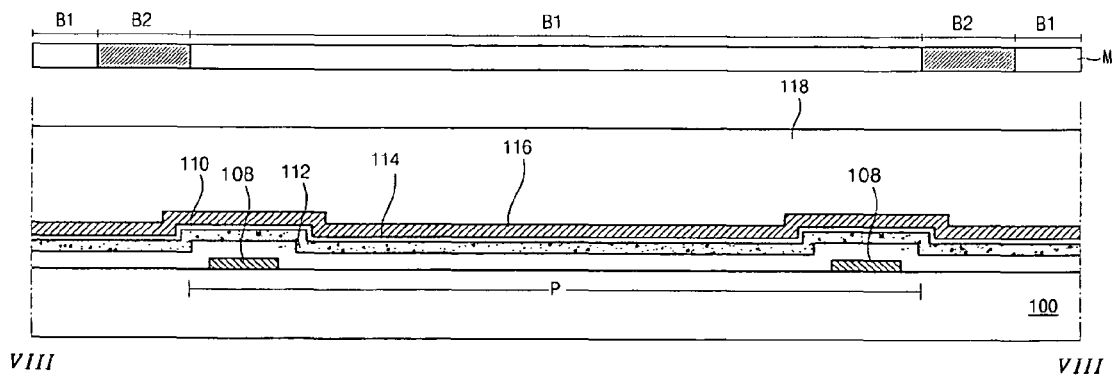
Figure 12C:
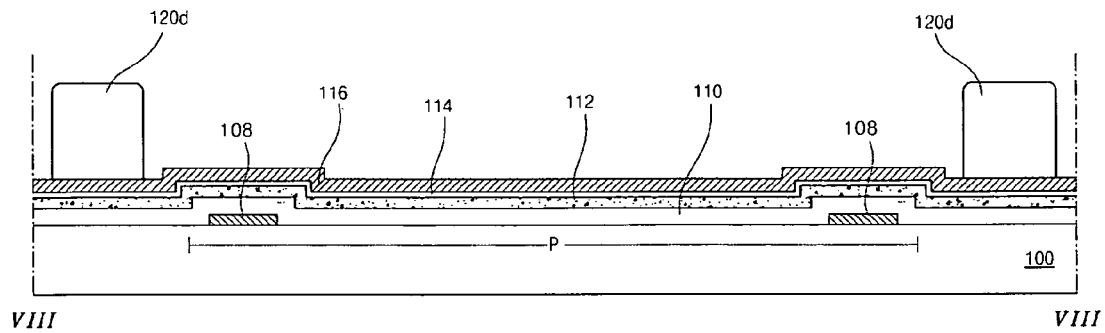
Figure 12D:
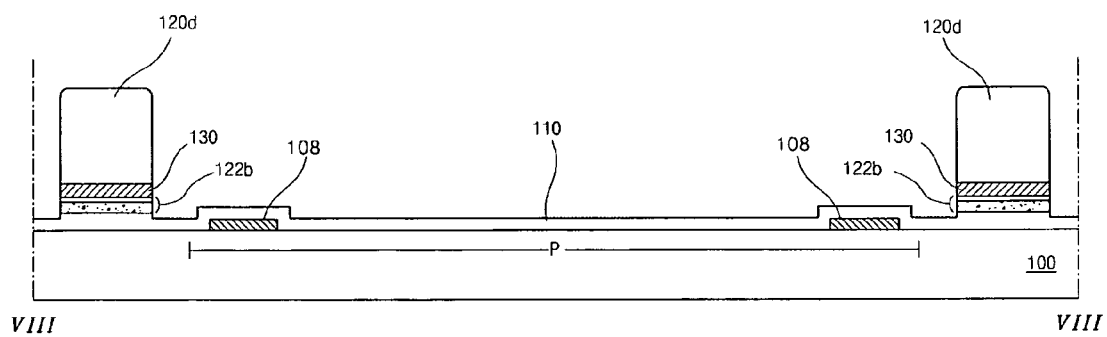
Figure 12E:
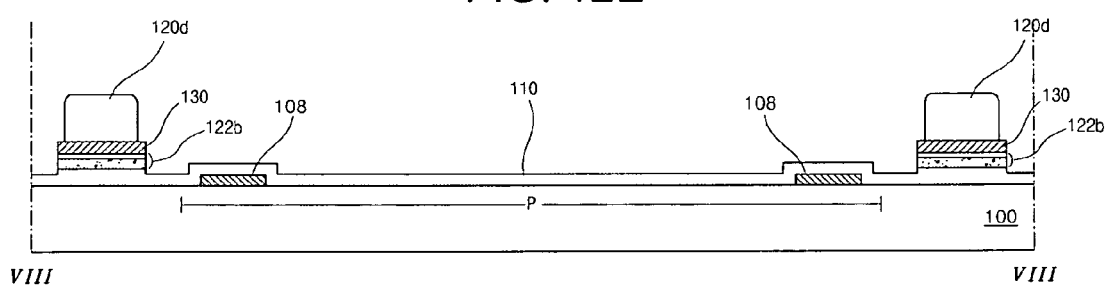
Figure 12F:
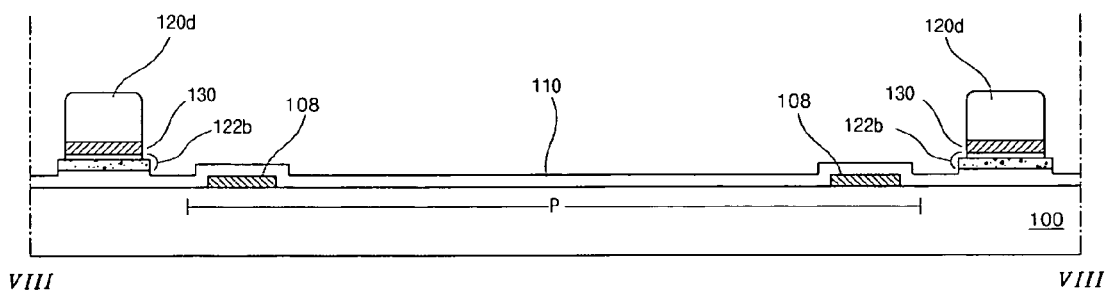
Figure 12G:
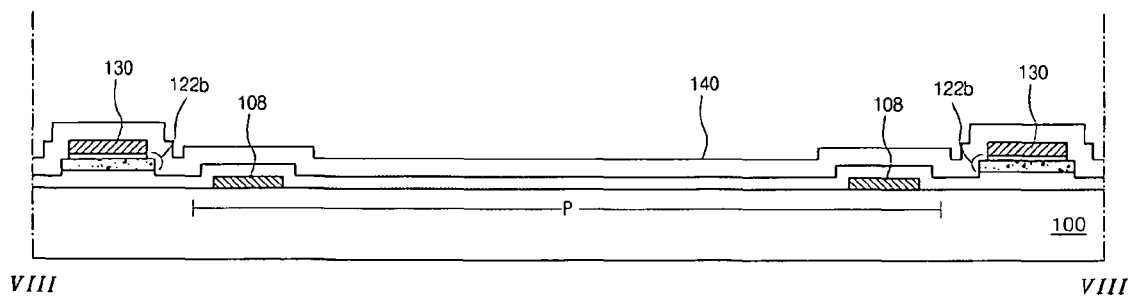
Figure 12H:
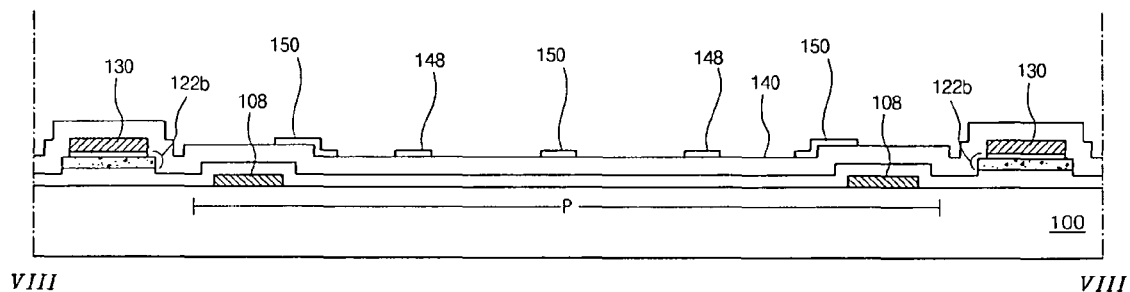

FIGS. 6 to 8 are cross-sectional views taken along lines V-V, VI-VI and VII-VII of FIG. 5, respectively.

Referring to FIGS. 6 to 8, the IPS-LCD device according to the embodiment of the present invention includes an array substrate B2, a color filter substrates B1 and a liquid crystal layer between the two substrates B1 and B2.

A gate line 102, a gate electrode 104 and a first common line 106a are on a first substrate 100. A gate insulating layer 110 is on the gate line 102, the gate electrode 104 and the first common line 106a. A semiconductor layer 136 is disposed on the gate insulating layer 110, and source and drain electrodes 132 and 134 are on the semiconductor layer 136. The semiconductor layer 136 includes an active layer 137 and an ohmic contact layer 138. The active layer 137 may be made of intrinsic amorphous silicon, and the ohmic contact layer 138 may be made of impurity-doped amorphous silicon.

A first height adjuster G1 may be disposed on the gate insulating layer 110 over the gate line 102, the first common line 106a or a second common line (106b of FIG. 5), for example, the gate line 102. A second height adjuster G2 may be disposed on the gate insulating layer 110 at a position where the gate line 102 and the first and second common lines 106a and 106b are not formed, for example, between the gate line 102 and the first common line 106a.

Each of the first and second height adjusters G1 and G2 include a semiconductor pattern, which has an intrinsic amorphous silicon pattern and an impurity-doped amorphous silicon pattern, and a conductive pattern sequentially disposed. The first and second height adjusters G1 and G2 may have substantially the same thickness.

A passivation layer 140 is disposed on the source and drain electrodes 132 and 134 and the first and second height adjusters G1 and G2. A thin film transistor T is disposed in a switching region S and includes the gate electrode 104, the semiconductor layer 136 and the source and drain electrodes 132 and 134. The gate line 102 and a data line (130 of FIG. 5) define a pixel region P. A pixel electrode (148 of FIG. 5), a second common electrode (150 of FIG. 5) and a connection portion 146 are disposed on the passivation layer 140 in the pixel region P.

A black matrix 202 is disposed on a second substrate 200. Red (R), green (G) and blue (B) color filter patterns 204a, 204b and 204c are disposed in the respective pixel regions P. A planarization layer 206 is disposed on the color filter patterns 204a, 204b and 204c.

A gap spacer 208 and first and second press-buffer spacers 210 and 212 are on the planarization layer 206. The gap spacer 208 and the first and second press-buffer spacers 210 and 212 may have substantially the same thickness.

The gap spacer 208 substantially corresponds to the first height adjuster G1 over the gate line 102. The gap spacer 208 may be disposed over the thin film transistor T, and the semiconductor layer 136 and the source and drain electrodes 132 and 134 function as the first height spacer G1. The first press-buffer spacer 210 is disposed substantially corresponding to the second height adjuster G2. The second press-buffer spacer 212 may be disposed substantially corresponding to the gate line 102, the first common line 106a or the second common line 106b, for example, the first common line 106a.

A height of the array substrate corresponding to the gap spacer 208 is substantially higher than a height of the array substrate corresponding to the first press-buffer spacer 210. The height of the array substrate corresponding to the first press-buffer spacer 210 is substantially higher than a height of the array substrate corresponding to the second press-buffer spacer 212. Accordingly, the gap spacer 208 contacts the array substrate B2 and the color filter substrate B1. A distance between the first press-buffer spacer 210 and the array substrate B2 is substantially less than a distance between the second press-buffer spacer 212 and the array substrate B2.

The array substrate of the IPS-LCD device according to an embodiment of the present invention is fabricated with four mask processes. The semiconductor layer 136 and the source and drain electrodes 132 and 134 are formed using dry-etching in the same mask process. During dry-etching, the gate insulating layer 110 is partially removed and a thickness of the gate insulating layer 110 is substantially reduced. Accordingly, the height of the array substrate corresponding to the second press-buffer spacer 212 is also substantially reduced in comparison with that of the related art array substrate. For example, the height difference between the array substrate corresponding to the gap spacer 208 and the array substrate corresponding to the second press-buffer spacer 212 is about 6500 Å. The height difference increase causes a force-relief function of the second press-buffer spacer 212 to be reduced. To compensate for a reduction of the function of the second press-buffer spacer, the first press-buffer spacer 210 and the second height adjuster G2 are formed in the IPS-LCD device.

When an outside force is applied, the first press-buffer spacer 210 first relieves the outside force, and the second press-buffer 212 secondly relieves the outside force. Accordingly, the height of the array substrate corresponding to the first press-buffer spacer 210 is substantially higher than the height of the array substrate corresponding to the second press-buffer spacer 212. As such, the second height adjuster G2 is formed below the first press-buffer spacer 210. The height of the array substrate corresponding to the first press-buffer spacer 210 should be substantially lower than the height of the array substrate corresponding to the gap spacer 208. As such, the second height adjuster G2 may be in a region between the gate line 102 and the first common line 106a. Accordingly, the height difference between the array substrate corresponding to the gap spacer 208 and the array substrate corresponding to the first press-buffer spacer 210 is about a thickness of the gate line 102 or the common line 106a or 106b i.e., about 2000 to about 2500 Å. This height difference may compensate for the height difference between the array substrate corresponding to the gap spacer 208 and the array substrate corresponding to the second press-buffer spacer 212.

When the second height adjuster G2 is in a region between the gate line 102 and the first common line 106a, the region between the gate line 102 and the first common line 106a may not be large enough to accommodate the second height adjuster G2 in the region. In other words, an area of the first press-buffer spacer 210 may be larger than the region available. When the region is not large enough, the gate line 102 and/or the first common line 106a may have a recess inside to accommodate the second height adjuster G2, as illustrated in FIG. 5.

As explained above, the heights of the array substrate corresponding to the gap spacer and the first and second press-buffer spacers may be adjusted by forming the first and second height adjusters and by adjusting positions of the first and second height adjusters. In other words, the gap spacer and the second press-buffer spacer are disposed over the gate line and the common line, but the height of the array substrate corresponding to the gap spacer is substantially higher than the height of the array substrate corresponding to the second press-buffer spacer by forming the first height adjuster below the gap spacer. The first and second height adjusters are disposed below the gap spacer and the first press-buffer spacer, but the height of the array substrate corresponding to the gap spacer is substantially higher than the height of the array substrate corresponding to the first press-buffer spacer by forming the first height adjuster at a position where the gate line is formed and forming the second height adjuster at a position where the gate line or the common line is not formed.

FIGS. 9A to 9H, 10A to 10H, 11A to 11H and 12A to 12H are cross-sectional views, taken along lines V-V, VI-VI, VII-VII and VIII-VIII of FIG. 5, respectively, illustrating a method of fabricating an array substrate for an IPS-LCD device according to embodiments of the present invention.

Referring to FIGS. 9A, 10A, 11A and 12A, a conductive material is deposited on a substrate 100 having a pixel region P and a switching region S and patterned with a first mask process to form a gate line 102, a gate electrode 104, a first common line 106a, a second common line (106b of FIG. 5) and a first common electrode 108. The conductive material may include aluminum (Al), aluminum neodymium alloy (AlNd), chromium (Cr), tungsten (W), molybdenum (Mo) and titanium (Ti). The gate line 102 and/or the first common line 106a may include recesses, as illustrated in FIG. 5.

Referring to FIGS. 9B, 10B, 11B and 12B, a gate insulating layer 110, an intrinsic amorphous silicon layer 112, an impurity-doped amorphous silicon layer 114 and a conductive layer 116 are sequentially formed on the substrate 100 having the gate line 102. A photoresist layer 118 is formed on the conductive layer 116. The gate insulating layer 110 may include silicon oxide ($SiO_2$) and silicon nitride ($SiN_x$). The conductive layer 116 may include aluminum (Al), aluminum neodymium alloy (AlNd), chromium (Cr), tungsten (W), molybdenum (Mo) and titanium (Ti).

A mask M having a transmitting portion B1, a blocking portion B2 and a semi-transmitting portion B3 is substantially placed over the photoresist layer 118. The semi-transmitting portion B3 may include a semi-transmitting film or slit patterns.

The semi-transmitting portion B3 corresponds to a part of the gate electrode 104. The blocking portion B2 is disposed at both sides of the semi-transmitting portion B3. The blocking portion B2 is disposed at both sides of the pixel regions P. The blocking portion B2 is disposed at a first region D1 in the gate line 102. The blocking portion B2 is disposed at a second region D2 between the gate line 102 and the first common line 106a. The photoresist layer 118 is exposed to light through the mask M and developed.

Referring to FIGS. 9C, 10C, 11C and 12C, by light exposure and developing, first to fourth photoresist patterns 120a to 120d are formed. The first photoresist pattern 120a corresponds to the switching region S. The second photoresist pattern 120b corresponds to the both sides of the pixel region P. The third photoresist pattern 120c corresponds to the first region D1. The fourth photoresist pattern 120d corresponds to the second region D2. The conductive layer 116, the intrinsic amorphous silicon layer 114 and the impurity-doped amorphous silicon 112 are etched using the first to fourth photoresist patterns 120a to 120d. A portion of the first photoresist pattern 120a corresponding to the semi-transmitting portion (B3 of FIG. 9B) is substantially thinner than other portions of the first photoresist pattern 120a corresponding to the blocking portion (B2 of FIG. 9B).

Referring to FIGS. 9D, 10D, 11D and 12D, by the etching, a source-drain pattern 124 and a first semiconductor pattern 122a are formed below the first photoresist pattern 120a. A data line 130 and a second semiconductor pattern 122b are formed below the second photoresist pattern 120b. A first height adjuster G1 having a first conductive pattern 126 and a third semiconductor pattern 122c is formed below the third photoresist pattern 120c. A second height adjuster G2 having a second conductive pattern 128 and a fourth semiconductor pattern 122d is formed below the fourth photoresist pattern 120d.

During etching, the gate insulating layer 110 between the first to fourth photoresist patterns 120a to 120d is also partially etched.

Referring to FIGS. 9E, 10E, 11E and 12E, the first to fourth photoresist patterns 120a to 120d are ashed. By ashing, the first to fourth photoresist patterns 120a to 120d are partially removed. Ashing is performed until the portion of the first photoresist pattern (120a of FIG. 9D) having substantially less thickness is completely removed. Accordingly, a center of the source-drain pattern 124 is exposed. Further, sides of the source-drain pattern 124, the data line 130 and the first and second conductive patterns 126 and 128 are also exposed.

Referring to FIGS. 9F, 10F, 11F and 12F, an etching process is performed using the ashed first to fourth photoresist patterns 120a to 120d. By etching, the center of the source-drain pattern (124 of FIG. 9E) and the impurity-doped amorphous silicon layer of the first semiconductor pattern (122a of FIG. 9E) are removed to form source and drain electrodes 132 and 134 and an ohmic contact layer 138. The intrinsic amorphous silicon layer of the first semiconductor pattern is referred to as an active layer 137. Further, the sides of the source-drain pattern and the impurity-doped amorphous silicon layer of the first semiconductor pattern are removed. The sides of the data line 130, the first and second conductive patterns 126 and 128, and the impurity-doped amorphous silicon layer of the second to fourth semiconductor patterns 122b to 122d are also removed.

During etching, the gate insulating layer 110 between the first to fourth semiconductor patterns is also partially etched. The ashed first to fourth photoresist patterns 120a to 120d are stripped.

Through the second mask process illustrated in FIGS. 9B to 9F, 10B to 10F, 11B to 11F and 12B to 12F, the gate insulating layer 110 between the first to fourth semiconductor patterns is partially etched twice. By the two etchings, a thickness of the gate insulating layer 110 between the first to fourth semiconductor patterns may be reduced by about 1000 Å.

Referring to FIGS. 9G, 10G, 11G and 12G, a passivation layer 140 is formed on the substrate 100 having the data line 130. The passivation layer 140 is patterned with a third mask process to form a drain contact hole 142 exposing the drain electrode 134 and a common contact hole (143 of FIG. 5) exposing the second common line (106b of FIG. 5). The passivation layer 140 may be made of an organic insulating material or an inorganic insulating material. The organic insulating material may include benzocyclobutene (BCB) and acrylic resin, and the inorganic insulating material may include silicon oxide ($SiO_2$) and silicon nitride (SiNx).

Referring to FIGS. 9H, 10H, 11H and 12H, a transparent conductive material is deposited on the passivation layer 140 and patterned with a fourth mask process to form a pixel electrode 148, a second common electrode 150 and a connection portion 146. The connection portion 146 contacts the drain electrode 134 through the drain contact hole 142, and the second common electrode 150 contacts the second common line through the common contact hole. The transparent conductive material may include indium-tin-oxide (ITO) and indium-zinc-oxide (IZO).

Through the above four mask processes, the array substrate according to an embodiment of the present invention may be fabricated.

Figure 13A:
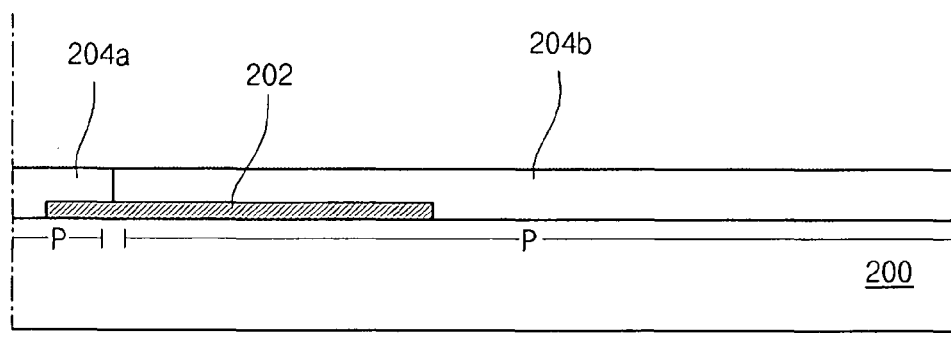
FIGS. 13A through and including 13C are cross-sectional views illustrating a method of fabricating a color filter substrate for an IPS-LCD device according to an embodiment of the present invention.
Figure 13B:
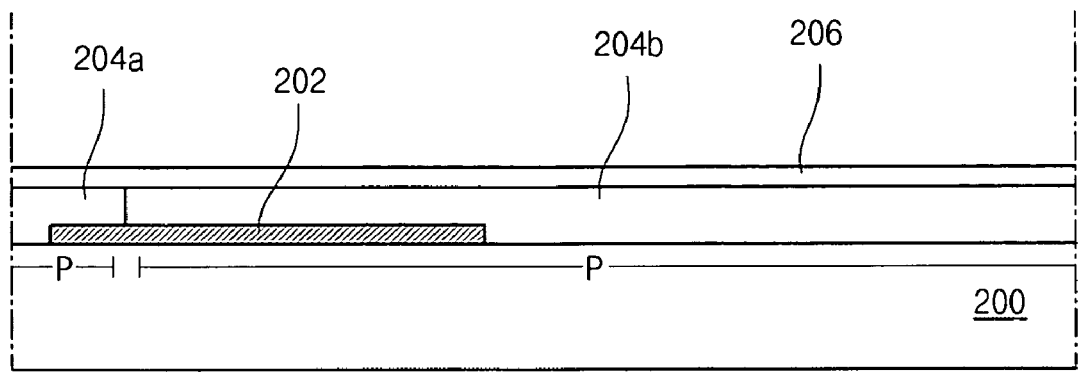
Figure 13C:
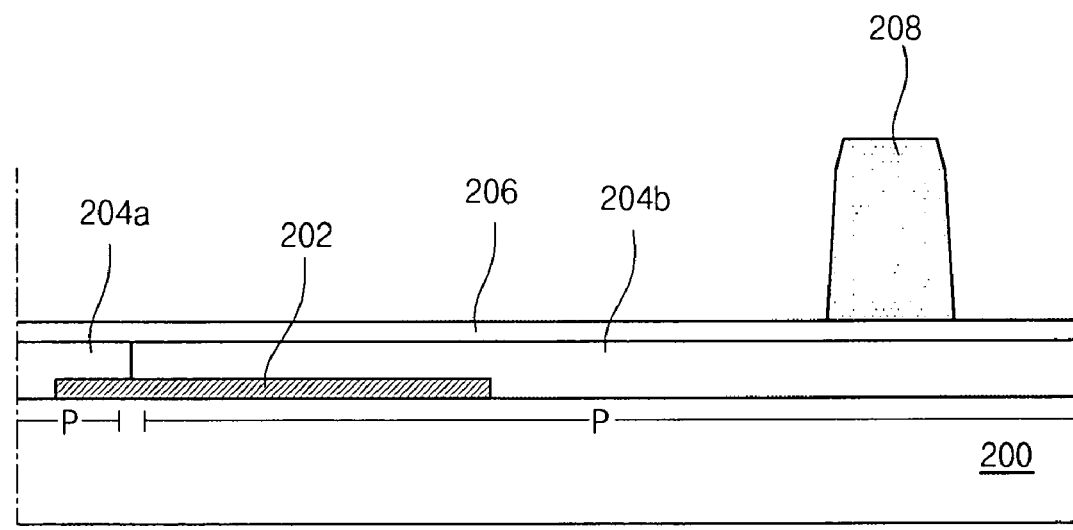

FIGS. 13A to 13C are cross-sectional views illustrating a method of fabricating a color filter substrate for an IPS-LCD device according to an embodiment of the present invention.

Referring to FIG. 13A, a black matrix 202 is formed on a substrate 200. The black matrix 202 is disposed at a peripheral portion of a pixel region P. The black matrix 202 may include chromium (Cr) and chromium oxide ($CrO_2$). Red, green and blue color filter patterns 204a and 204b are formed corresponding to the respective pixel regions P.

Referring to FIG. 13B, an organic insulating material is deposited on the substrate 200 having the color filter patterns 204a and 204b to form a planarization layer 206. The organic material may include benzocyclobutene (BCB) and acrylic resin.

Referring to FIG. 13C, an organic insulating material is deposited on the planarization layer 206 and patterned to form a gap spacer 208 and first and second press-buffer spacers (210 of FIG. 8 and 212 of FIG. 6). The organic material may include benzocyclobutene (BCB) and acrylic resin.

Through the above-explained processes, the color filter substrate according to an embodiment of the present invention may be fabricated.

The array substrate and the color filter substrate are attached with a liquid crystal layer interposed therebetween to complete the IPS-LCD device.

As explained above, because the array substrate is fabricated with four mask processes, product cost and product time can be reduced. Further, because the first press-buffer spacer is formed to compensate for the second press-buffer spacer, degradation of display quality due to an outside force can be reduced. Further, because the common electrode and the pixel electrode are transparent, high brightness can be obtained. Further, because the common electrodes are disposed at sides of the pixel region, a coupling between the data line and the pixel electrode can be reduced.

The present invention can be applicable to not only the IPS mode LCD device but also other various mode LCD devices.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A liquid crystal display device, comprising:
   an array substrate including:
   a gate line and a common line on a first substrate, the common line spaced apart from the gate line;
   a gate insulating layer on the gate line and the common line, wherein the gate insulating layer has first and second thicknesses, and wherein the first thickness is greater than the second thickness;
   a data line on the gate insulating layer and crossing the gate line to define a pixel region;
   a thin film transistor connected to the gate and data lines, the thin film transistor includes a gate electrode connected to the gate line, a semiconductor layer on the gate insulating layer having the first thickness, and source and drain electrodes on the semiconductor layer, the source electrode connected to the data line; and
   first and second height adjusters, the first height adjuster on the gate insulating layer having the first thickness over at least one of the gate line and the common line, the second height adjuster on the gate insulating layer having the second thickness between the gate line and the common line, the first and second height adjusters has a semiconductor pattern and a conductive pattern that are made of the same material as the semiconductor layer and the source and drain electrodes, respectively;

an opposing substrate facing the array substrate;

a liquid crystal layer between the array substrate and the opposing substrate;

a gap spacer corresponding to the first height adjuster and contacting the array substrate and the opposing substrate;

a first press-buffer spacer corresponding to the second height adjuster, contacting the opposing substrate and spaced apart from the array substrate; and a second press-buffer spacer contacting the opposing substrate, corresponding to and spaced apart from a portion of the array substrate that has the gate insulating layer having the second thickness, wherein a distance between the first press-buffer spacer and the array substrate is substantially less than a distance between the second press-buffer spacer and the array substrate.

2. The device according to claim 1, wherein the second press-buffer spacer corresponds to at least one of the gate line and the common line.

3. The device according to claim 1, wherein the semiconductor layer includes an intrinsic amorphous silicon layer and an impurity-doped amorphous silicon layer on the intrinsic amorphous silicon layer.

4. The device according to claim 1, wherein the semiconductor layer extends below the data line.

5. The device according to claim 1, wherein the intrinsic amorphous silicon layer protrudes outside the impurity-doped amorphous silicon layer.

6. The device according to claim 1, wherein the semiconductor layer and the source and drain electrodes are used as the first height adjuster.

7. The device according to claim 1, further comprising a pixel electrode and a first common electrode alternately arranged in the pixel region, wherein the pixel electrode is connected to the thin film transistor and the first common electrode is connected to the common line.

8. The device according to claim 7, wherein the common line includes a first sub-common line and a second sub-common line which are located at both ends of and connected by a second common electrode, the second common electrode being outside the pixel electrode, the first sub-common line connected to the first common electrode.

9. The device according to claim 8, wherein the first common electrode substantially overlaps the second common electrode, the first common electrode at the same layer as the pixel electrode and the second common electrode extending from the first and second sub-common lines.

10. The device according to claim 8, further comprising a passivation layer having a drain contact hole which the pixel electrode is connected to the thin film transistor through and a common contact hole, which the first common electrode is connected to the first sub-common line through, along with the gate insulating layer.

11. The device according to claim 1, wherein the opposing substrate includes a black matrix, a color filter layer and a planarization layer, on a second substrate.

12. The device according to claim 1, wherein a portion of the array substrate corresponding to the gap spacer is substantially higher than a portion of the array substrate corresponding to the first press-buffer spacer, and the portion of the array substrate corresponding to the first press-buffer spacer is substantially higher than a portion of the array substrate corresponding to the second press-buffer spacer.

13. The device according to claim 12, wherein the gap spacer and the first and second press-buffer spacers have substantially the same thickness.

14. The device according to claim 12, wherein the first and second height adjusters have substantially the same thickness.

15. The device according to claim 1, wherein a height difference between a portion of the array substrate corresponding to the gap spacer and a portion of the array substrate corresponding to the first press-buffer spacer is about 2500 Å.

16. The device according to claim 1, wherein a portion of the gate insulating layer below the first and second height adjusters is about 1000Å thicker than a portion of the gate insulating layer below the second press-buffer spacer.

* * * * *